United States Patent [19]
Kazama

[11] Patent Number: 5,631,574
[45] Date of Patent: May 20, 1997

[54] CONTACT PROBE UNIT

[75] Inventor: Toshio Kazama, Nagano-ken, Japan

[73] Assignee: NHK Spring Co., Ltd., Yokohama, Japan

[21] Appl. No.: 358,122

[22] Filed: Dec. 15, 1994

[30] Foreign Application Priority Data

Dec. 17, 1993 [JP] Japan .................................. 5-343791
Apr. 1, 1994 [JP] Japan .................................. 6-087337

[51] Int. Cl.$^6$ .................................................. G01R 31/02
[52] U.S. Cl. ............................................................ 324/761
[58] Field of Search .................................. 324/761, 754, 324/765, 755

[56] References Cited

U.S. PATENT DOCUMENTS

| | | | |
|---|---|---|---|
| 4,851,765 | 7/1989 | Driller et al. | 324/761 |
| 5,157,325 | 10/1992 | Murphy | 324/761 |
| 5,317,255 | 5/1994 | Suyama et al. | 324/754 |
| 5,389,885 | 2/1995 | Swart | 324/761 |
| 5,434,513 | 7/1995 | Fujii et al. | 324/765 |

*Primary Examiner*—Ernest F. Karlsen
*Assistant Examiner*—Russell M. Kobert
*Attorney, Agent, or Firm*—Skjerven, Morrill, MacPherson, Franklin & Friel; Alan H. MacPherson; Thomas S. MacDonald

[57] ABSTRACT

An electronic device is interposed between a pair of contact units of a contact probe unit without using any soldering or other permanent connecting arrangement. Alternatively, the electronic device is interposed between a securing plate and a contact unit provided with a pair of arrays of contact modules. Thus, the electronic device may be incorporated in the contact probe unit without requiring any permanent connecting arrangement such as soldering which may produce any contaminants or other undesirable substances or cannot be readily detached and attached. This is particularly important in a clean room environment. According to a preferred embodiment of the present invention, said electronic device comprises an integrated circuit mounted on said sheet member. For instance, the electronic device may consist of a TAB for driving an LCD panel so that the LCD panel may be tested in a realistic condition.

13 Claims, 4 Drawing Sheets

CONTACT PROBE UNIT

CROSS REFERENCE TO RELATED PATENTS AND CO-PENDING APPLICATIONS

The following patents and co-pending patent applications are directed to subject matters similar to those of the present application, and are commonly assigned to NHK Spring Co., Ltd. Reference should be made to the disclosure of these patents and patent applications, and the contents of the copending applications are hereby incorporated with the present application by reference.

| application Ser. No. | Filing Date | Remarks |
|---|---|---|
| unknown | even date | |
| 08/148,488 | November 8, 1993 | U.S. Pat. No. 5,414,369 issued May 9, 1995 |
| 08/148,489 | November 8, 1993 | U.S. Pat. No. 5,410,260 issued April 25, 1995 |
| 08/013,465 | February 4, 1993 | U.S. Pat. No. 5,394,099 issued February 28, 1995 |
| 07/739,051 | July 30, 1991 | U.S. Pat. No. 5,200,695 issued April 6, 1993 |
| 07/737,763 | July 30, 1991 | U.S. Pat. No. 5,189,364 issued February 23, 1993 |
| 07/600,198 | October 19, 1990 | Div. of 07/536,516 U.S. Pat. No. 5,084,673 issued January 28, 1992 |
| 07/536,516 | June 12, 1990 | U.S. Pat. No. 5,003,255 issued March 26, 1991 |
| 07/424,511 | October 20, 1989 | U.S. Pat. No. 5,004,977 issued April 2, 1991 |

TECHNICAL FIELD

The present invention relates to a contact probe unit, and in particular to a contact probe unit which is suitable for testing LCD panels and arrays of electronic components including points to be tested arranged at a high density.

BACKGROUND OF THE INVENTION

Conventionally, contact probe units have been widely used for testing electroconductive patterns of printing circuit boards and various electronic devices, and there have been attempts to modify them into more suitable forms for testing LCD panels. In testing an LCD panel, it is desirable to test it at a condition which closely simulates the actual condition of the final product, and it is therefore desirable to test the LCD panel by using a TAB (an LSI chip used for driving an LCD panel) identical to that used in the final product. Because a large number of wires must be connected between the LCD panel and the TAB, preferably, the TAB should be incorporated in the contact probe unit itself.

However, the TAB may have to be replaced from time to time either due to a failure of the TAB or a change in the specification of the product. If the TAB is connected to the contact modules by soldering, a substantial amount of work is necessary for replacing the TAB. Also, soldering tends to produce a large amount of foreign particles, and it is detrimental to the clean room environment in which LCD panels are produced. Therefore, when replacing the TAB, it would be necessary to take the contact probe unit out of the clean room environment, and replace the TAB. Furthermore, it would be necessary to thoroughly clean the contact probe unit before bringing the contact probe unit back into the clean room.

In some of the contact probe units proposed by the present inventor and disclosed in the above mentioned patents and patent applications, each contact module comprises a compression coil spring received in a support hole or a tubular receptacle, and a pair of needle members attached to the corresponding ends of the compression coil spring to urge them outward. The extent by which each of the needle members projects from the corresponding end of the support hole or the receptacle is determined by suitable stopper means. The inventor has considered the possibility of adapting such contact probe units for incorporating a TAB in such a manner as to allow replacement of the TAB in a simple manner.

BRIEF SUMMARY OF THE INVENTION

In view of such problems of the prior art, a primary object of the present invention is to provide a contact probe unit which can incorporate therein an electronic device in a readily replaceable manner.

A second object of the present invention is to provide a contact probe unit which can incorporate therein an electronic device in such a manner as to allow replacement of the electronic device without producing any foreign matters detrimental to maintaining a clean room environment.

A third object of the present invention is to provide a contact probe unit which can incorporate therein an electronic device without substantially increasing the size of the contact probe unit.

A fourth object of the present invention is to provide a contact probe unit which can incorporate therein an electronic device without substantially increasing the complexity of the contact probe unit.

These and other objects of the present invention can be accomplished by providing a contact probe unit for electrically accessing parts to be tested, comprising: a first contact unit comprising a base having an upper surface and a lower surface, and a plurality of contact modules arranged in the base, each of the contact modules comprising an upper needle member and a lower needle member projecting from the upper and lower surfaces of the base, respectively, and spring means for resiliently urging at least one of the needle members in a direction to project from the associated surface of the base, the lower needle members being adapted to be contacted with the parts to be electrically accessed; a second contact unit comprising a base having an upper surface and a lower surface, and a plurality of contact modules arranged in the base, each of the contact modules comprising an upper needle member and a lower needle member projecting from the upper and lower surfaces of the base, respectively, and spring means for resiliently urging at least one of the needle members in a direction to project from the associated surface of the base; an electronic device including a sheet member carrying a first array of terminals on a lower surface thereof and a second array of terminals on an upper surface thereof; means for assembling the first and second contact units one over the other with at least part of the sheet member of the electronic device interposed therebetween in such a manner as to contact the upper needle members of the first contact unit with the first array of terminals, and contact the lower needle members of the second contact unit with the second array of terminals; and means for connecting the upper needle members of the second contact unit to an external circuit.

According to the present invention, it is also possible to incorporate all of the contact modules in a common single base. In this case, a first array of contact modules and a second array of contact modules are arranged in a first part of the base and a second part of the base, respectively, each of the contact modules comprising an upper needle member and a lower needle member projecting from the upper and lower surfaces of the base, respectively, and spring means for resiliently urging at least one of the needle members in a direction to project from the associated surface of the base, the lower needle members of the first array of contact modules being adapted to be contacted with the parts to be electrically accessed; and an electronic device including a sheet member carrying a first array of terminals and a second array of terminals on different parts of a lower surface thereof is interposed between a securing plate for securing the electronic device on the upper surface of the base in such a manner as to contact the upper needle members of the first contact module array with the first array of terminals, and contact the upper needle members of the second contact module array with the second array of terminals. The lower needle members of the second contact module array are connected to an external circuit by suitable means.

Thus, the electronic device may be incorporated in the contact probe unit without requiring any soldering or other connecting means which may produce any contaminants or other undesirable substances or cannot be readily detached and attached. This is particularly important in a clean room environment.

According to a preferred embodiment of the present invention, the electronic device comprises an integrated circuit mounted on the sheet member. For instance the electronic device may consist of a TAB for driving an LCD panel so that the LCD panel may be tested in a realistic condition.

Preferably, the base comprises a layered structure including an upper insulating plate, an intermediate insulating plate and a lower insulating plate, each of the contact modules being received in a through hole passed through the base, and each of the through holes consists of a relatively large support hole passed through the intermediate insulating plate, a pair of relatively small support holes passed through the upper and lower insulating plates, all in a substantially coaxial relationship, each of the needle members being provided with a shoulder surface (which for instance may be defined by a radial flange) which engages with an annular shoulder surface defined between the large support hole and a corresponding one of the small support holes so as to determine an extent by which the corresponding needle member resiliently projects from the corresponding surface. Because the needle members are received in the through holes formed directly in the base without using any tubular receptacles, each contact module may have an extremely small outer diameter, and can be arranged close to one another. This is important when applying the contact probe unit to integrated circuits and other electronic devices where densely distributed parts are to be accessed.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
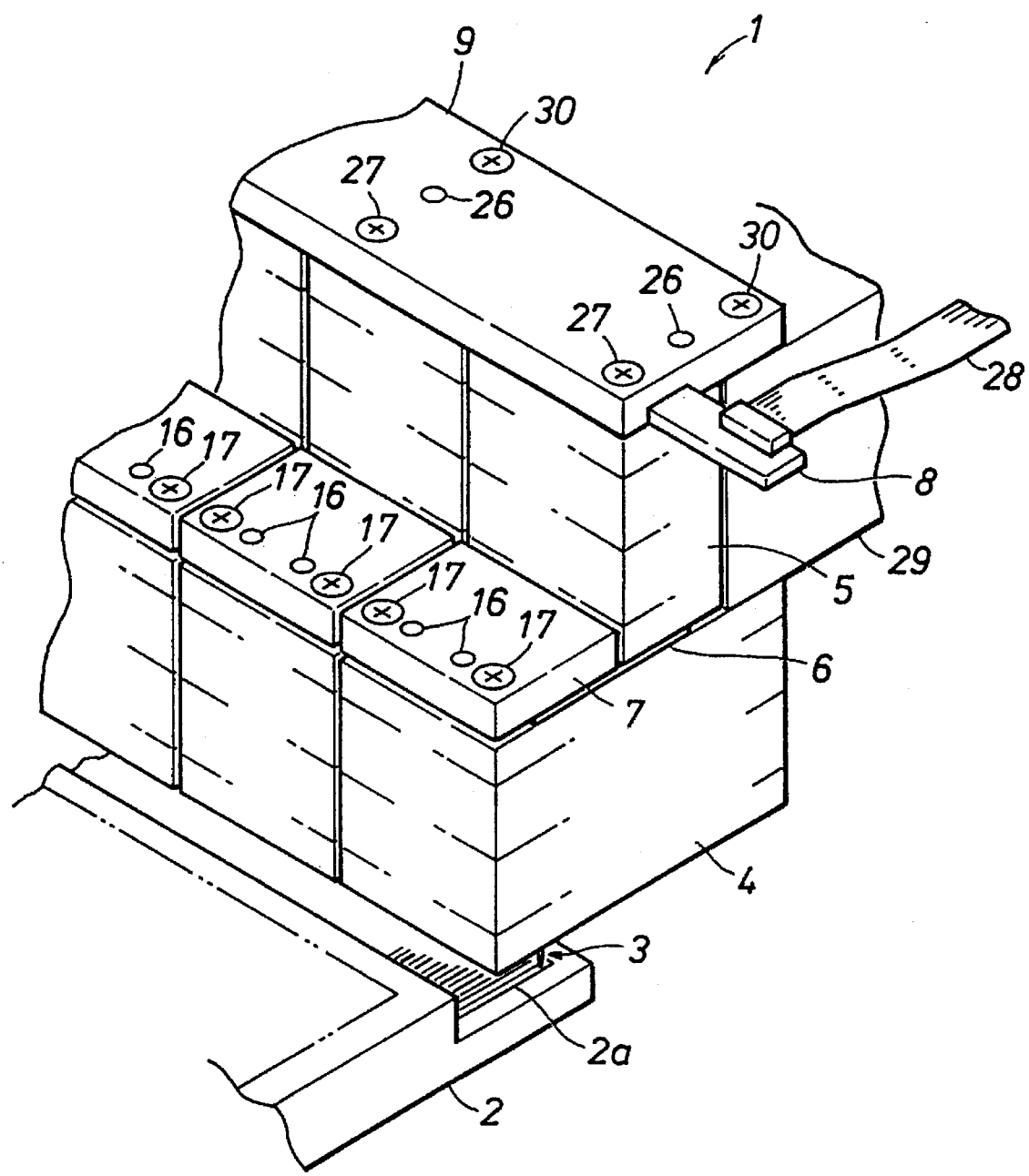
FIG. 1 is a perspective view of a first embodiment of the contact probe unit according to the preset invention.

FIG. 1 is a perspective view of a first embodiment of the contact probe unit according to the present invention as it is applied to an LCD panel 2. The LCD panel 2 is lighted up for testing purpose by driving each cell thereof before it is finally connected to a TAB which serves as an LSI for driving the LCD panel 2.

As shown in FIG. 1, the contact probe unit 1 comprises a lower contact unit 4 incorporating a plurality of contact modules 3 for contact with input terminals 2a of the LCD panel 2, an upper contact unit placed over the lower contact unit 4 incorporating similar contact modules for contact with a printed circuit board 8 which leads to an external testing circuit, and a TAB assembly consisting of a TAB 6 and a securing plate 7 interposed between the upper and lower contact units 4 and 5.

Figure 2:
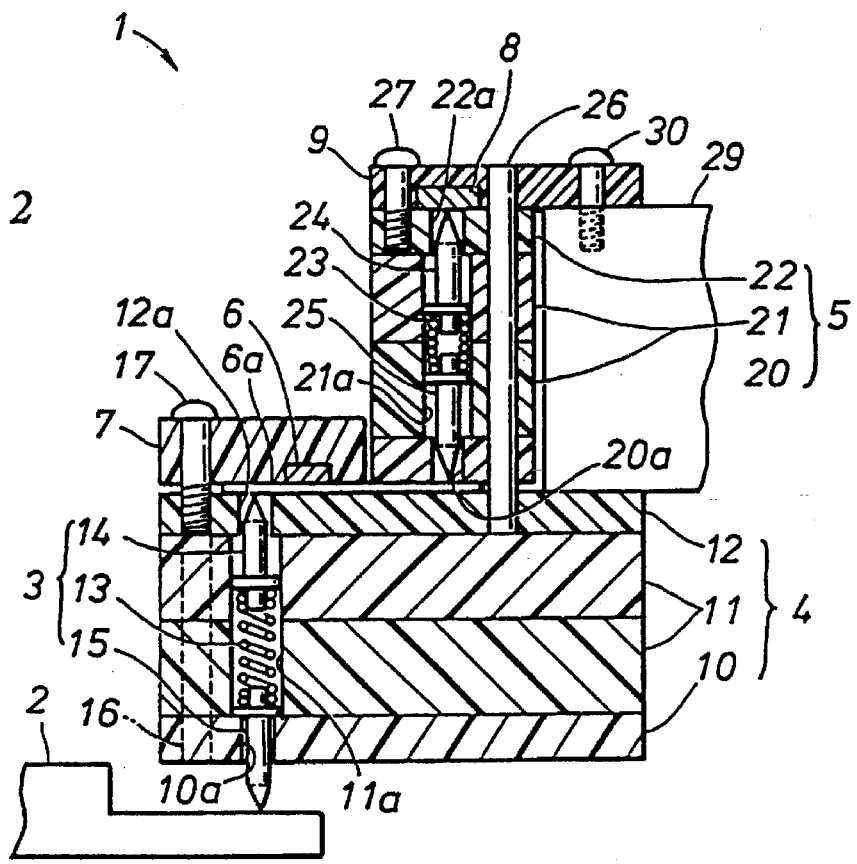
FIG. 2 is a sectional view of the contact probe unit.
Figure 3:
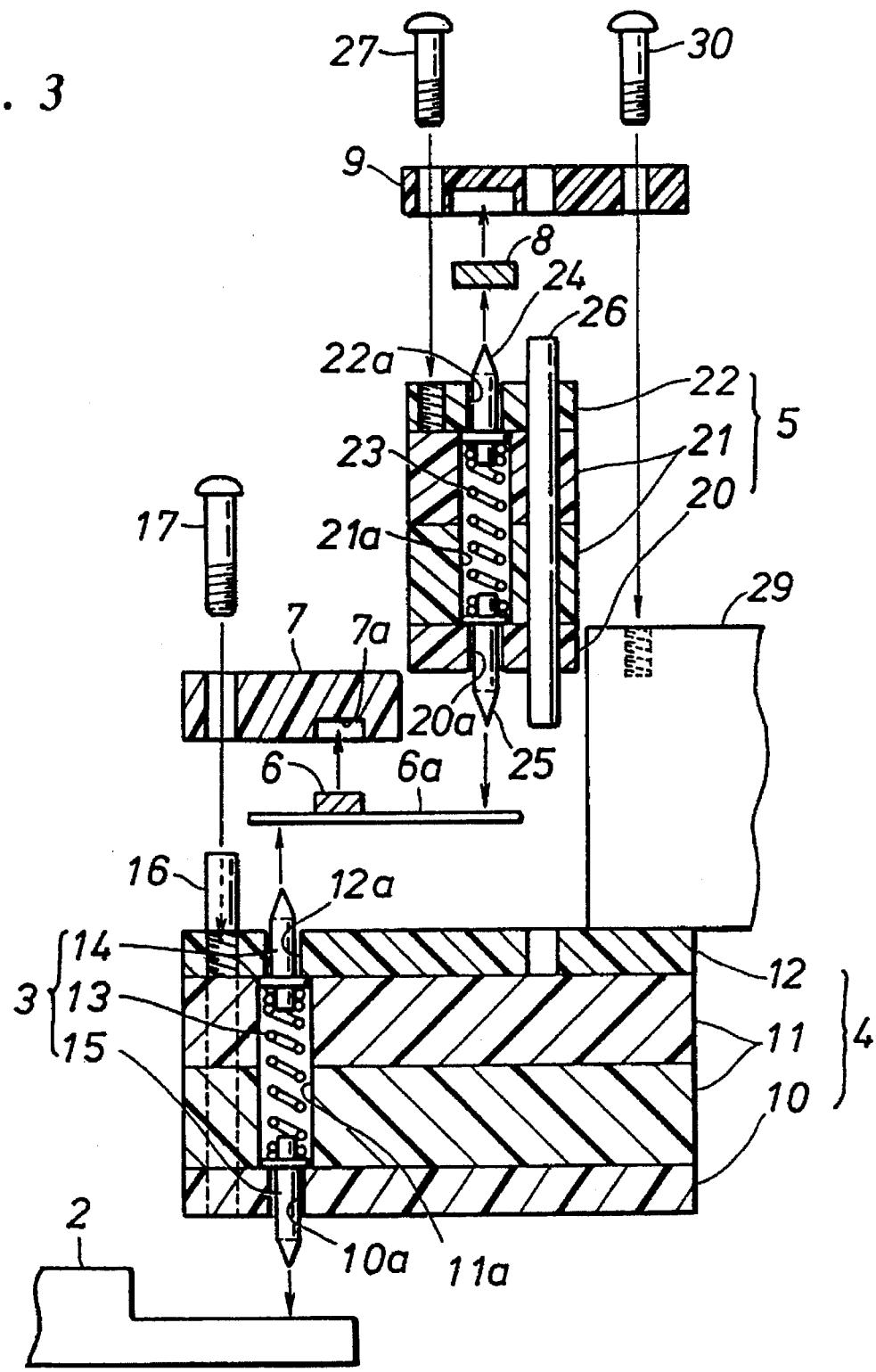
FIG. 3 is an exploded perspective view of the contact probe unit.

Referring to FIGS. 2 and 3, the lower contact unit 4 is provided with layered structure comprising a relatively thin lower insulating plate member 10, a pair of relatively thick intermediate insulating plate members 11, and a relatively thin upper insulating plate member 12 in that order. The intermediate plate members 11 are each provided with a plurality of relatively large support holes 11a, and the upper and lower plate members 12 and 10 are each similarly provided with a relatively small support hole 12a or 10a. These support holes 10a, 11a and 12a are mutually aligned so as to form a plurality of through holes passed vertically through the lower contact unit 4.

A compression coil spring 13 is coaxially received in each of the support holes 11a in a slightly prestressed condition, and the two ends of each compression coil spring 13 are integrally connected to the base ends of the needle members 14 and 15, respectively, for instance by soldering or brazing. The soldering connection between the compression coil spring and the needle members results in a small fluctuation in electric resistance (at most a few %), and a highly stable measurement or test can be made possible. Each of the needle members 14 and 15 is provided with a radial flange defining an annular shoulder surface which rests on a corresponding annular shoulder surface defined between the corresponding larger support hole 11a and the associated one of the smaller support holes 10a or 12a. Thus, each of the needle members 14 and 15 is urged outward by the corresponding compression coil spring 13, but is prevented from coming out of the support hole by virtue of the engagement between the radial flange and the associated shoulder surface of the support hole. The contact modules 3 each consisting of the coil spring 13 and the two needle members 14 and 15 are provided by the same number as the number of the input terminals 2a.

The insulating plates 10 to 12 are registered with each other by locating pins 16 passed through them, and are integrally joined together by threaded bolts 17 passed through them. The locating pins 16 ensure that the support holes 10a to 12a are kept in a coaxial relationship. The upper end of each of the locating pins 16 projects from the upper surface of the upper insulating plate member 12 by a certain length, and the aforementioned securing plate 7 is positioned on the upper surface of the upper insulating plate member 12 with the aid of these locating pins 16.

The TAB 6 is secured to the lower surface of the securing plate 7. The TAB 6 is identical to the TABs incorporated in the completed LCD panels for driving them, and consists of an LSI chip having terminals printed on a sheet member 6a. The TAB main body is received in a recess 7a provided in the lower surface of the securing plate 7 which is in turn secured to a front end of the upper surface of the lower contact unit 4 with threaded bolts 17. The terminals printed on the upper surface of the sheet member 6a are designed to be connected to the printed circuit board 8 via the upper contact unit 5 as described hereinafter, and the terminals printed on the lower surface of the sheet member 7a are designed to be connected to the input terminals 2a of the LCD panel 2 via the lower contact unit 4.

The upper end of each of the needle members 14 and 15 projects by a certain length from the upper surface or the lower surface of the lower contact unit 4 as the case may be. Therefore, when the TAB 6 is placed onto the upper surface of the lower contact unit 4, the upper needle members 14 are pushed into the support holes 12a against the spring force of the compression coil springs 13, and a favorable electric contact can be established between the TAB 6 and the terminals 2a of the LCD panel 2.

The sheet member 6a of the TAB 6 extends to the rear part of the upper surface of the lower contact unit 4, and the upper contact unit 5 is placed over the upper surface of the rear part of the lower contact unit 4 with the sheet member 6a interposed between them.

The upper contact unit 5 has a similar layered structure as the lower contact unit 4, and comprises a lower insulating plate member 20, a pair of intermediate insulating plate members 21, and an upper insulating plate member 22 in that order. The intermediate plate members 21 are each provided with a plurality of relatively large support holes 21a, and the upper and lower plate members 22 and 20 are each similarly provided with a relatively small support hole 22a or 20a. These support holes 10a, 11a and 12a are mutually aligned so as to form a plurality of through holes passed vertically through the upper contact unit 5. A contact module consisting of a compression coil spring 23 and a pair of needle members 24 and 25 attached to the respective ends of the compression coil spring 23 is received in each of these through holes.

Likewise, locating pins 26 are passed through the upper contact unit 5 to secure the insulating plates 20 to 22 in properly registered condition, and the upper ends of the locating pins 26 are fitted into the associated holes of a securing plate 9 clamping the printed circuit board 8 between the securing plate 9 and the upper surface of the upper contact unit 5. The securing plate 9 is secured to the upper contact unit 5 with threaded bolts 27.

In the assembled state, the terminals printed on the upper surface of the sheet member 6a of the TAB 6 are resiliently contacted by the lower needle members 25, and the printed terminals of the printed circuit board 8 are resiliently contacted by the upper needle members 24. The printed circuit board 8 is in turn connected, via a connector, to a flat cable 28 leading to an external control or testing circuit. Typically, the number of individual wires in the flat cable 28 may be substantially less than the number of the terminals 2a of the LCD panel 2.

The securing plate 9 extends rearward beyond the rear end of the upper contact unit 5, and a frame member 29 is interposed between the upper surface of the lower contact unit 4 and the lower surface of the securing plate 9. As best shown in FIG. 2, the thickness or the vertical dimension of the frame member 29 is identical to the combined vertical dimension of the upper contact unit 5 and the sheet member 6a. The lower ends of the locating pins 26 for the upper contact unit 5 project from the lower surface of the upper contact unit 5, and fit into associated holes formed in the lower contact unit 4. Thus, the locating pins 26 ensure proper registrations not only between the insulating plates 20 to 22 but also between the upper contact unit 5 and the lower contact unit 4 and between the securing plate 9 and the upper contact unit 5. Threaded bolts 27 and 30 are passed between the upper securing plate 9 and the upper contact unit 5 and between the upper securing plate 9 and the frame member 5, respectively. Threaded bolts not shown in the drawings are passed through the lower contact unit 4, and are threaded into the frame member 29. Thus, the two contact units 4 and 5 are placed one over the other, and are mutually joined together via the frame member 29.

The LCD panel 2 can be tested by mounting a plurality of contact probe units 1 as described above on the frame member 29 arranged along the X- and Y-axes of the LCD panel 2, and contacting the lower needle members 15 of the lower contact unit 4 to the terminals 2a of the LCD panel 2. A control signal is supplied to the printed circuit board 8 for activating the TAB 6, and the TAB 6 in turn drives and lights up the LCD panel 2.

The contact probe unit 1 is assembled by joining a number of component parts together by using threaded bolts, and can be dissembled by unfastening these threaded bolts. As best illustrated in FIG. 3, the upper contact unit 5 can be separated from the lower contact unit 4 by unfastening the threaded bolts 30, and the securing plate 9 can be removed and the printed circuit board 8 can be exposed by unfastening the threaded bolts 27. By unfastening the threaded bolts 17, the securing plate 7 can be separated from the lower contact unit 4 to expose the TAB 6.

According to the present invention, the connection to the TAB 6 and the printed circuit board 8 is accomplished via contact modules instead of soldering. Therefore, in case of a failure of the TAB 6, it can be readily removed from the contact probe unit 1, and replaced by a new TAB simply by unfastening and fastening threaded bolts. This can be accomplished not only in a simple manner but also in such a manner as not to disrupt a clean room environment.

Figure 4:
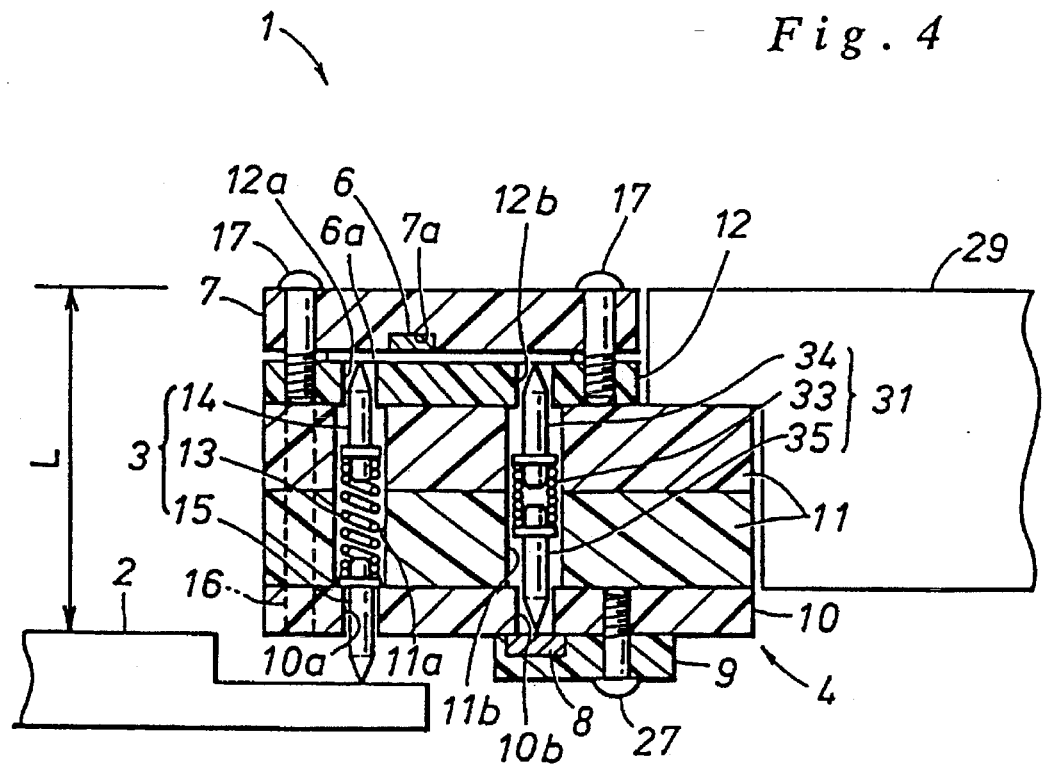
FIG. 4 is a sectional view of a second embodiment of the contact probe unit according to the present invention.
Figure 5:
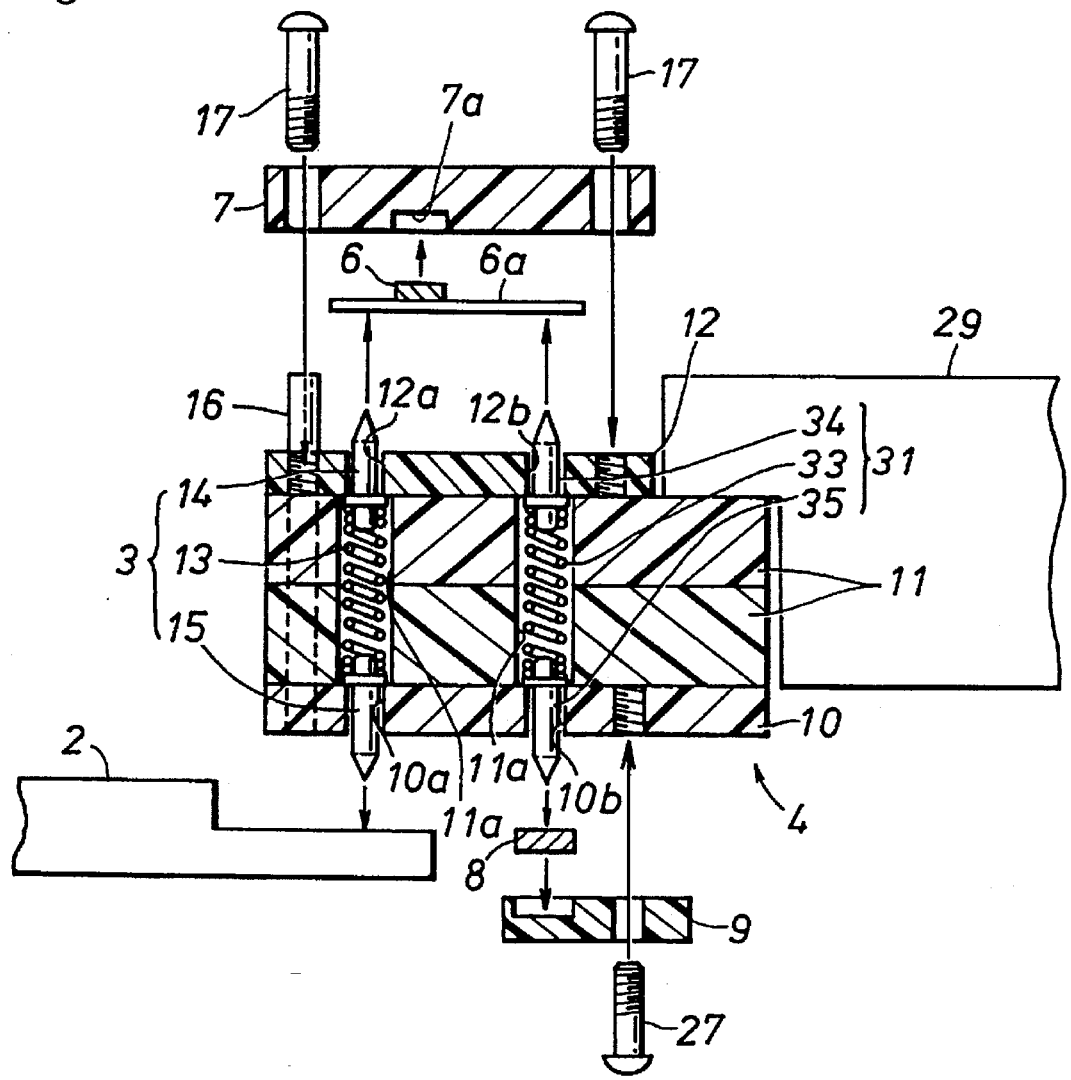
FIG. 5 is an exploded perspective view of the contact probe unit.

FIGS. 4 and 5 show a second embodiment of the present invention, and in these drawings the parts corresponding to those of the previous embodiment are denoted with like numerals.

In this embodiment, the lower contact unit 4 is provided with larger support holes 11b and smaller support holes 10b and 12b similar to the holes 11a, 10a and 12a in a parallel relationship. The support holes 11b, 10b and 12b likewise jointly form through holes passed vertically through the lower contact unit 4, and a contact module consisting of a compression coil spring 33 and a pair of needle members 34 and 35 attached to the corresponding ends of the compression coil spring 33 is received in each of these through holes.

A securing plate 7 is attached to the upper surface of the lower contact unit 4 with threaded bolts 17, and a TAB 6 is attached the bottom surface of a recess 7a formed in the lower surface of the securing plate 7. The TAB 6 is provided with a sheet member 6a extending in both forward and rearward directions, and an array of laterally arranged printed terminals are formed on each of the forward and rearward extending parts of the sheet member 6a. The positions of the contact modules are arranged in two different arrays in such a manner that the upper needle members 14 and 34 of the first and second arrays of contact modules are brought into contact with the first and second arrays of printed terminals, respectively.

In this embodiment, a printed circuit board 8 is attached to the lower surface of a rear part of the lower contact unit 4, and is secured thereto by a securing plate 9 which is in turn secured to the lower insulating plate 10 with threaded bolts 27. The control signal supplied to the printed circuit board 8 is transmitted to the lower needle members 35, and then to the upper needle members 34 of the second contact module array. The upper needle members 34 are in contact with the array of terminals in the rear extension of the sheet member 9. The array of terminals in the front extension of the sheet member 9 are in contact with the upper needle members 14 of the first contact module array, and are thus electrically connected to the terminals 2a of the LCD panel 2 via the compression coil springs 13 and the lower needle members 15.

According to this embodiment, as there is no upper contact unit, and the entire assembly is incorporated into the lower contact unit, the overall height of the contact probe unit can be substantially reduced as compared with the previous embodiment. The reduced height of the contact probe unit improves the visibility of the front surface of the LCD panel at the time of testing. The TAB 6 may have to be replaced from time to time, and it can be readily achieved by unfastening the threaded bolts 17, and removing the securing plate 7. The printed circuit board 8 can be also readily removed by unfastening the threaded bolts 27 and removing the securing plate 9. As opposed to the soldering which tends to produce foreign particles, the work involved in replacing these component parts according to the present invention produces almost no particles which could be detrimental to clean room environment.

Thus, according to the present invention, an electronic device may be incorporated in the contact probe unit without requiring any permanent connecting arrangement such as soldering which may produce any contaminants or other undesirable substances or cannot be readily detached and attached. This is particularly important in a clean room environment. Also, the work involved in replacing the electronic device is very little, and can maintain and remodel the contact probe unit quickly and economically.

Although the present invention has been described in terms of specific embodiments thereof, it is possible to modify and alter details thereof without departing from the spirit of the present invention.

What we claim is:

1. A contact probe unit for electrically accessing parts to be tested, comprising:
   a first contact unit comprising
   a first base having a first surface and an opposite second surface, and
   a plurality of first contact modules arranged in said first base,
   each of said first contact modules comprising a first needle member and a second needle member projecting from said first and said second surfaces of said first base, respectively, and first spring means for resiliently urging at least one of said first and second needle members in a direction to project from the associated first and second surfaces of said first base, said second needle members being adapted to be contacted with the parts to be electrically accessed;
   a second contact unit, stacked and abuttingly secured on said first contact unit, said second contact unit comprising
   a second base having a third surface and an opposite fourth surface, and
   a plurality of second contact modules arranged in said second base,
   each of said second contact modules comprising a third needle member and a fourth needle member projecting from said third and said fourth surfaces of said base, respectively, and second spring means for resiliently urging at least "one of said third and fourth needle members in a direction to project from the associated third and fourth surfaces of said second base;
   an electronic device including a sheet member carrying a first array of terminals on a first sheet member surface thereof and a second array of terminals on a second sheet member surface thereof;
   means for assembling said first and second contact units one over the other with at least part of said sheet member of said electronic device interposed therebetween in such a manner as to have said sheet number contact said first needle members of said first contact unit with said first array of terminals, and contact said fourth needle members of said second contact unit with said second array of terminals;
   means for connecting said third needle members of said second contact unit to an external circuit; and
   wherein said first base comprises a layered structure including a first insulating plate, an intermediate insulating plate and a second insulating plate, each of said first contact modules being received in a though hole passed through said layered structure.

2. A contact probe unit according to claim 1, wherein said electronic device comprises an integrated circuit mounted on said sheet member.

3. A contact probe unit according to claim 1, wherein only one of said first and second arrays of terminals are interposed between said first and second contact units, and a main body of said electronic device and the remaining part of said sheet member is interposed between one of said first and second contact units and a securing plate.

4. A contact probe unit according to claim 1 wherein each of said through holes consists of a relatively large support hole passed through said intermediate insulating plate, a pair of relatively small support holes passed through said first and said second insulating plates, all in a substantially coaxial relationship, each of said first and second needle members being provided with a shoulder surface which engages with a corresponding annular shoulder surface defined between said large support holes and a corresponding one of said small support holes so as to determine an extent by which the corresponding first and second needle members resiliently projects from the corresponding surface.

5. A contact probe unit according to claim 1 further comprising locating pins extending between said layered structure to secure said insulating plates into registered condition.

6. A contact probe unit for electrically accessing parts to be tested, comprising:
   a base having a first surface and an opposite second surface;
   a first plurality of contact modules arranged in said base;
   a second plurality of contact modules arranged in said base and laterally displaced from said first plurality of contact modules;
   each of said first plurality and second plurality of contact modules comprising a first needle member and a second needle member, at least one of said first plurality and said second plurality of contact modules projecting from said second surface of said base, and spring means for resiliently urging at least one of said needle members in a direction to project from an associated surface of said base, said first needle members of said first plurality of contact modules being adapted to be contacted with the parts to be electrically accessed;

an electronic device including a sheet member carrying a first array of terminals on a first surface portion thereof and a second array of terminals on a second surface portion thereof;

means for abuttingly securing and stacking said sheet member of said electronic device on said base in such a manner as to contact said second needle members of said first plurality of contact modules with said first array of terminals and to contact one of said first and second needle members of said second plurality of contact modules with said second array of terminals;

means for connecting the other of said needle members of said second plurality of contact modules to an external circuit; and wherein said base comprises a layered structure including a first insulating plate, an intermediate insulating plate, and a second insulating plate, each of said first contact modules being received in a through hole passed through said layered structure.

7. A contact probe unit according to claim 6, wherein said electronic device comprises an integrated circuit mounted on said sheet member.

8. A contact probe unit according to claim 6, wherein said contact probe unit comprises a first contact unit and a second contact unit, and wherein only one of said first and second arrays of terminals are interposed between said first and second contact units and a main body of said electronic device, and a remaining part of said sheet member is interposed between one of said first and second contact units and a securing plate.

9. A contact probe unit of claim 6, in which said means for connecting includes a securing plate for securing said electronic device on said first surface of said base with said sheet member of said electronic device interposed between said securing plate and said first surface of said base in such a manner as to contact said first needle members of said first plurality of contact modules with said first array of terminals, and contact said second needle members of said second plurality of contact modules with said second array of terminals.

10. A contact probe unit for electrically accessing parts to be tested, comprising:

a base having a first surface and an opposite second surface;

a first array of contact modules arranged in a first part of said base and a second array of contact modules arranged in a second part of said base, each of said contact modules comprising a first needle member and a second needle member projecting from said first and second surfaces of said base, respectively, and spring means for resiliently urging at least one of said needle members in a direction to project from an associated surface of said base, said second needle members of said first array of contact modules being adapted to be contacted with said parts to be electrically accessed;

an electronic device including a sheet member carrying a first array of terminals and a second array of terminals on different parts of a surface of said sheet member;

a securing plate for securing said electronic device on said first surface of said base with said sheet member of said electric device interposed between said securing plate and said first surface of said base in such a manner as to contact said first needle members of said first contact module array with said first array of terminals, and contact said first needle members of said second contact module array with said second array of terminals; and means for connecting said second needle members of said second contact module array to an external circuit.

11. A contact probe unit according to claim 10, wherein said electronic device comprises an integrated circuit mounted on said sheet member.

12. A contact probe unit according to claim 10, wherein said base comprises a layered structure including an upper insulating plate, an intermediate insulating plate and a lower insulating plate, each of said contact modules being received in a through hole passed through said base.

13. A contact probe unit according to claim 10, wherein each of said through holes consists of a relatively large support hole passed through said intermediate insulating plate, a pair of relatively small support holes passed through said upper and lower insulating plates, all in a substantially coaxial relationship, each of said first and second needle members being provided with a shoulder surface which engages with a corresponding annular shoulder surface defined between said large support hole and a corresponding one of said small support holes so as to determine an extent by which the corresponding needle member resiliently projects from a corresponding surface of said base.

* * * * *